(12) United States Patent
Tokita et al.

(10) Patent No.: US 7,815,425 B2
(45) Date of Patent: Oct. 19, 2010

(54) PROCESSING APPARATUS

(75) Inventors: Toshinobu Tokita, Utsunomiya (JP); Hirohisa Ota, Kawagoe (JP); Eigo Kawakami, Utsunomiya (JP); Takashi Nakamura, Tokyo (JP); Kazuyuki Kasumi, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 337 days.

(21) Appl. No.: 11/093,067

(22) Filed: Mar. 28, 2005

(65) Prior Publication Data

US 2005/0212156 A1 Sep. 29, 2005

(30) Foreign Application Priority Data

Mar. 29, 2004 (JP) .............................. 2004-096992

(51) Int. Cl.
*B29C 35/08* (2006.01)
*B29C 43/14* (2006.01)

(52) U.S. Cl. .................. 425/174.4; 264/1.36; 264/494; 355/71

(58) Field of Classification Search .............. 425/174.4; 427/510; 264/1.1, 1.36, 405, 497; 355/53, 355/71
See application file for complete search history.

(56) References Cited

U.S. PATENT DOCUMENTS

| | | | | | |
|---|---|---|---|---|---|
| 5,354,414 | A | * | 10/1994 | Feygin | 216/34 |
| 5,597,590 | A | * | 1/1997 | Tanimoto et al. | 425/174.4 |
| 5,772,905 | A | | 6/1998 | Chou | 216/44 |
| 5,928,593 | A | * | 7/1999 | Harrison | 264/251 |
| 5,985,202 | A | * | 11/1999 | Ozaki et al. | 264/401 |
| 6,334,960 | B1 | | 1/2002 | Willson et al. | 216/52 |
| 6,387,787 | B1 | | 5/2002 | Mancini et al. | 438/586 |
| 6,482,742 | B1 | * | 11/2002 | Chou | 438/690 |
| 6,517,977 | B2 | | 2/2003 | Resnick et al. | 430/5 |
| 6,653,030 | B2 | * | 11/2003 | Mei et al. | 430/5 |
| 6,696,220 | B2 | | 2/2004 | Bailey et al. | 425/385 |
| 6,719,915 | B2 | | 4/2004 | Willson et al. | 216/44 |
| 6,762,823 | B2 | * | 7/2004 | Suzuki | 355/52 |
| 6,805,054 | B1 | | 10/2004 | Meissl et al. | 101/483 |
| 6,932,934 | B2 | * | 8/2005 | Choi et al. | 264/496 |
| 7,064,805 | B2 | * | 6/2006 | Nemoto | 355/53 |
| 7,084,952 | B2 | * | 8/2006 | Jeunink et al. | 355/30 |

(Continued)

FOREIGN PATENT DOCUMENTS

JP 10-106921 4/1998

(Continued)

OTHER PUBLICATIONS

European Search Report issued in corresponding European Patent Application No. 05006759.4 dated Aug. 21, 2009.

(Continued)

*Primary Examiner*—Yogendra N Gupta
*Assistant Examiner*—Emmanuel S Luk
(74) *Attorney, Agent, or Firm*—Rossi, Kimms & McDowell LLP (57) ABSTRACT

A processing apparatus for transferring a relief pattern on a mold to a resist on a substrate through a compression of the mold against the resist, includes a supplier for supplying the resist between the substrate and the mold, and an illumination optical system for illuminating ultraviolet light onto the resist via the mold so as to cure the resist.

2 Claims, 11 Drawing Sheets

U.S. PATENT DOCUMENTS

| | | | |
|---|---|---|---|
| 2002/0018197 A1* | 2/2002 | Suzuki | 355/403 |
| 2002/0031732 A1* | 3/2002 | Shoji | 430/396 |
| 2002/0098426 A1 | 7/2002 | Sreenivasan et al. | |
| 2002/0150398 A1 | 10/2002 | Choi et al. | |
| 2003/0047691 A1* | 3/2003 | Musil et al. | 250/492.2 |
| 2004/0048169 A1* | 3/2004 | Miyasaka | 430/5 |
| 2004/0197433 A1* | 10/2004 | Terada et al. | 425/174.4 |
| 2005/0270312 A1 | 12/2005 | Lad et al. | |
| 2008/0084550 A1* | 4/2008 | Liu | 355/72 |
| 2008/0111979 A1* | 5/2008 | Emoto | 355/30 |
| 2008/0143987 A1* | 6/2008 | Uemura | 355/67 |

FOREIGN PATENT DOCUMENTS

| | | |
|---|---|---|
| JP | 2000-269122 A | 9/2000 |
| JP | 2002-086463 A | 3/2002 |
| JP | 2003-158067 A | 5/2003 |
| JP | 2003-218007 | 7/2003 |
| WO | 02/06902 A2 | 1/2002 |
| WO | 2004/016406 A1 | 2/2004 |

OTHER PUBLICATIONS

Colburn, M et al. "Step and Flash Imprint Lithography: A New Approach to High-Resolution Patterning" Proceedings of the SPIE-The International Society for Optical Engineering, vol. 3676, Mar. 15, 1999, pp. 379-389. Cited in Search Report issued in corres. EP 05006759.4 dated Aug. 21, 2009; see NPL Cite No. 1.

* cited by examiner

PROCESSING APPARATUS

BACKGROUND OF THE INVENTION

The present invention relates generally to processing apparatuses, and more particularly to a processing apparatus that transfers a pattern on a mold as an original onto a substrate such as a wafer. The present invention is particularly suitable for a processing apparatus that uses the nanoimprint technology for the fine processing to manufacture semiconductor devices, micro electro-mechanical systems ("MEMS's"), and the like.

The nanoimprint technology is one alternative to the photolithography that uses the ultraviolet ("UV") light, X-rays and electron beams to form fine patterns for semiconductor devices. The nanoimprint presses (or stamps) a model (or a mold), on which a fine pattern has been formed by the electron-beam exposure etc., against a substrate such as a wafer to which a resinous material (resist) is applied, thereby transferring the pattern onto the resist. See, for example, S. Y. Chou, et al., Science, Vol. 272 pp. 85-87, 5 Apr., 1996. It is already demonstrated that the nanoimprint can transfer a fine shape of about 10 nm, and attracts attention especially as a fine periodic pattern forming means for magnetic recording media. Active researches and developments are globally under way.

The nanoimprint sometimes uses the vacuum environment to prevent intrusions of air bubbles between a mold and a substrate. Methods that facilitate the resist flow at the press time include a (heat cycle) method of heating polymer as the resist more above the glass transition temperature for transfer, and a (photo-curing) method of exposing and curing the UV curable resin as the resist while pressing it with a transparent mold, and of releasing the mold.

A manufacture of semiconductor integrated circuits ("ICs") requires an overlay that transfers the next pattern with a precise alignment with a circuit pattern already formed on a substrate. The heat cycle method heats the resist, causes the substrate and mold to thermally expand with a temperature rise, and has difficulties in maintaining the overlay accuracy. Accordingly, the photo-curing method, in which temperature control is relatively easy, is more suitable in applying the nanoimprint to the manufacture of the semiconductor ICs.

For the minimum critical dimension ("CD") of a semiconductor IC pattern of 100 nm or less, the resist requires a low-viscosity material to fully fill in the mold's fine structure. A nanoimprint apparatus typically successively transfers a pattern onto a wafer surface in a step-and-repeat manner. Here, the "step-and-repeat manner" is one mode of exposure method that moves a wafer stepwise to an exposure area for the next shot every shot of cell projection onto the wafer. However, due to the low viscosity of the resist, it is difficult to previously apply resist to a substrate, transport and mount the substrate as in an exposure apparatus. One proposed method drops a proper quantity every time the mold is pressed in transferring each shot. See, for example, U.S. Pat. No. 6,334,960.

The mold includes plural patterns for plural chips, and generally has a rectangular shape, whereas a wafer has a circular shape. Therefore, in transferring a mold pattern matrix-wise onto a wafer, the mold outstretches the wafer's peripheral shot (referred to as a "peripheral shot" hereinafter) that is smaller than the mold size, thus resulting in a partial transfer of the mold pattern. The partial transfer of the mold pattern to the peripheral area is economical and beneficial because some of the plural chip patterns in the mold are transferred.

However, the resist for the peripheral shot cures outside the wafer, and sticks to the mold when the mold is released, clogging the mold pattern. This clog causes a defect in transferring the mold pattern to the next shot, lowering the yield. Alternatively, the step of removing the cured resist from the mold is needed, lowering the operability and throughput. On the other hand, if the mold pattern is not transferred to the peripheral shot, the economical efficiency and productivity deteriorate.

BRIEF SUMMARY OF THE INVENTION

The present invention is directed to a processing apparatus having good overlay accuracy and economical efficiency, and providing fine processing, by preventing the resist from adhering to the mold.

A processing apparatus according to one aspect of this invention for transferring a relief pattern on a mold to a resist on a substrate through a compression of the mold against the resist, includes a supplier for supplying the resist between the substrate and the mold, and an illumination optical system for illuminating ultraviolet light onto the resist via the mold so as to cure the resist.

A processing apparatus for transferring a relief pattern on a mold to a resist on a substrate through a compression of the mold against the resist, includes a supplier for supplying the resist between the substrate and the mold, and a controller for controlling a supply amount of the resist by the supplier, wherein the substrate includes a plurality of shots, to each of which the pattern is transferred, wherein the shots are different in shape between the central and peripheral parts on the substrate, and wherein the controller controls the supply amount so that the supplier can supply a predetermined amount of resist corresponding to an area of the shot.

A device manufacturing method according to still another aspect of this invention including the steps of transferring a pattern onto resist on a substrate using the above processing apparatus, and etching the substrate. Claims for the device manufacturing method that exhibits operations similar to those of the above processing apparatus cover devices as their intermediate products and finished products. Such products include semiconductor chips, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

Figure 1:
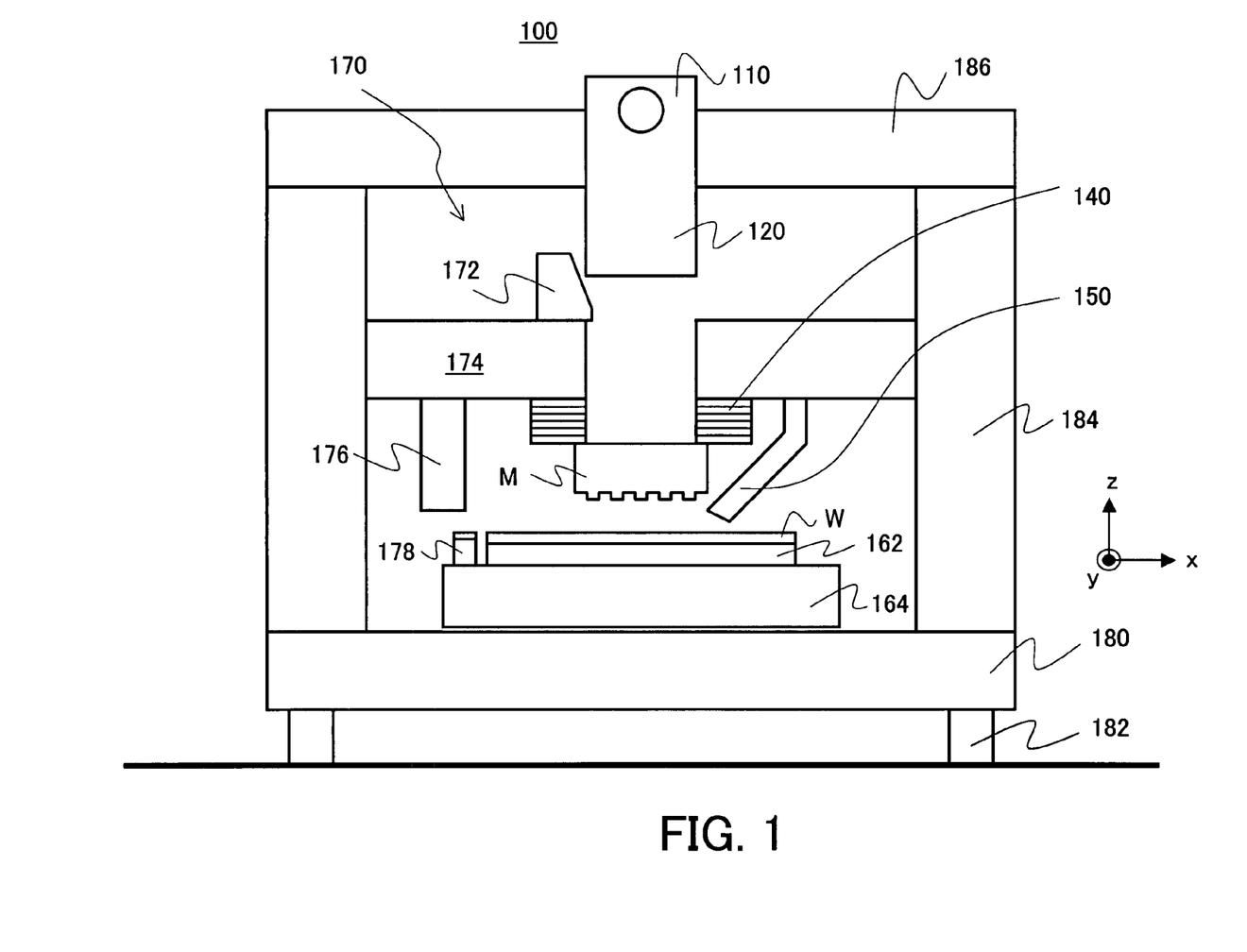
FIG. 1 is a schematic sectional view of a processing (or nanoimprint) apparatus according to a first embodiment of the present invention.

Referring now to the accompanying drawings, a description will be given of a photo-curing nanoimprint apparatus 100 as a processing apparatus according to a first embodiment of this invention. Like elements in each figure are designated by the like reference numerals, and a duplicate description thereof will be omitted. Here, FIG. 1 is a schematic sectional view of the nanoimprint apparatus 100.

The nanoimprint apparatus 100 includes a photo-curing means, a mold M, a mold driver, a wafer (substrate) W, a wafer driver, a resist supply means, an alignment mechanism 170, and other mechanisms.

Figure 2:
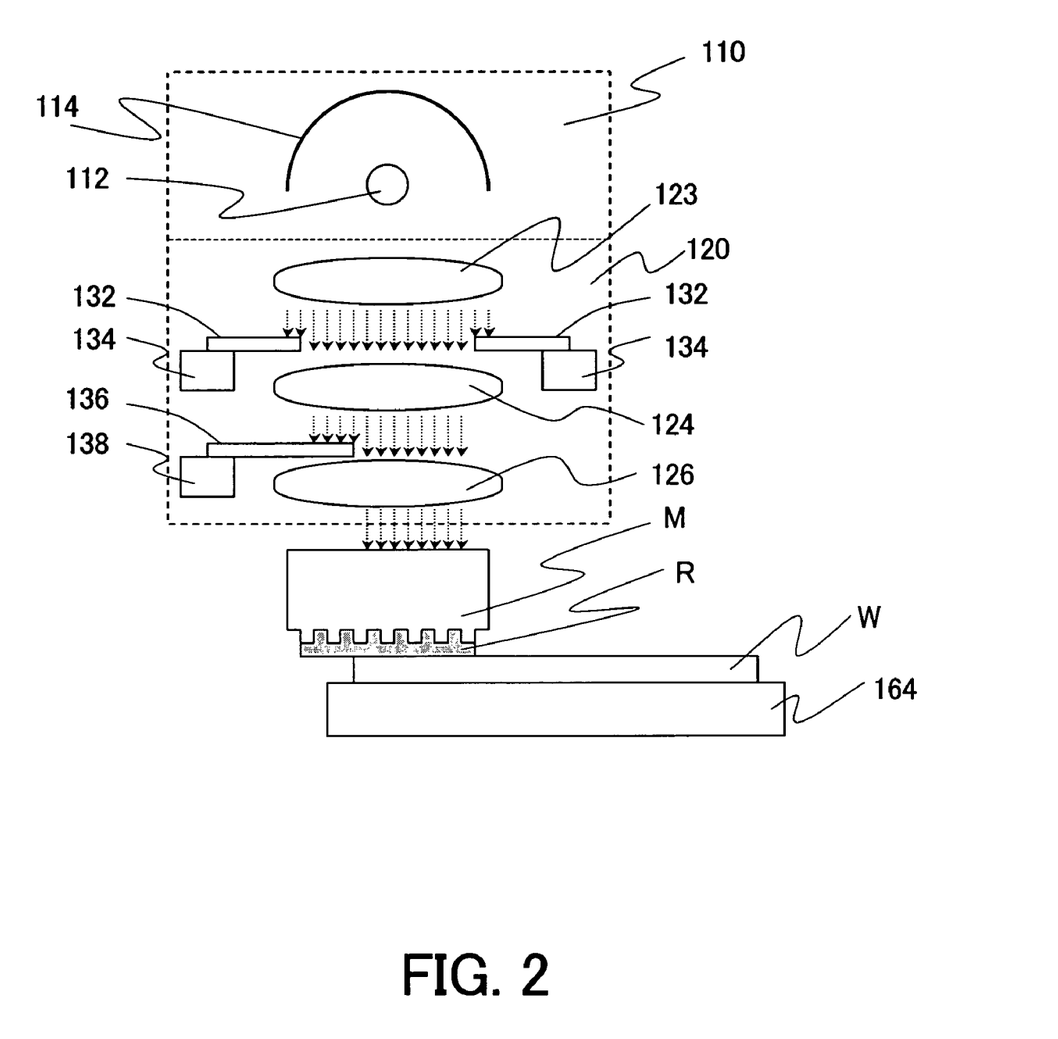
FIG. 2 is a schematic sectional view of an illumination apparatus applicable to the processing apparatus shown in FIG. 1.
Figure 3:
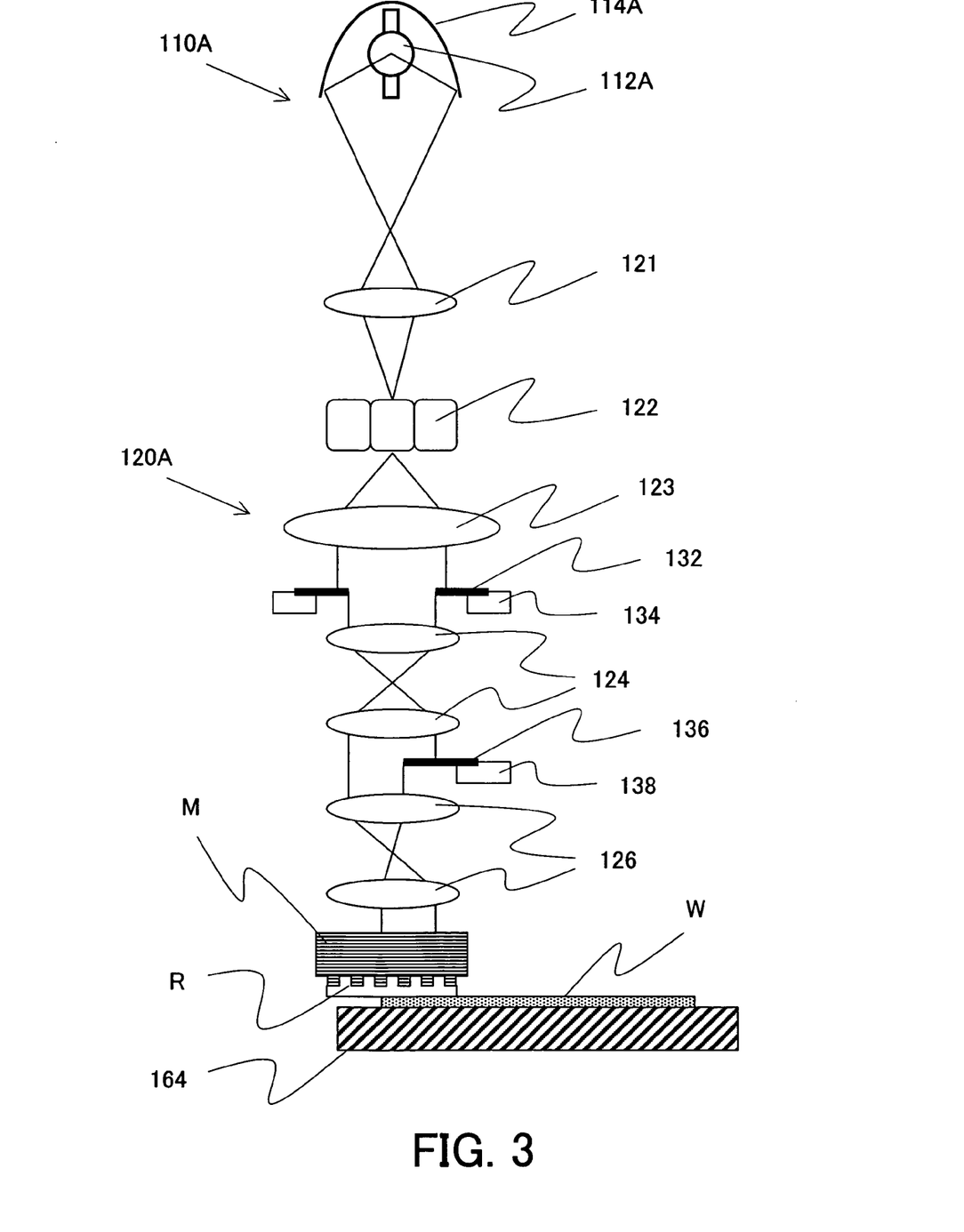
FIG. 3 is a schematic sectional view of another illumination apparatus applicable to the processing apparatus shown in FIG. 1.

The photo-curing means irradiates the UV light to the resist R via the mold M, and cures the resist R. The photo-curing means includes a light source section 110 and an illumination optical system 120. The light source section 110 includes a mercury lamp for generating the UV light and the like. For example, the light source section 110 includes a light source 112 and a mirror surface 114 shown in FIG. 2 or a light source 112A and an elliptical mirror 114A shown in FIG. 3. The light sources 112 and 112A are both lamps (such as i-line, g-line, and the like), and the light is once condensed by the mirror surface 114 or the elliptical mirror 114A to form an optical image. Here, FIG. 2 shows a concrete structure covering the light source section 110 and illumination optical system 120 shown in FIG. 1, and FIG. 3 shows the light source section 110A and illumination optical system 120A as another embodiment that can be applied to the light source section 110 and illumination optical system 120 shown in FIG. 1.

The illumination optical system 120 includes lenses and apertures that shape illumination light for exposing and curing the resist R and irradiating it to the resist plane. The illumination optical system 120 includes, for example, as shown in FIG. 2, a lens 123, imaging optical systems 124 and 126, an angle-of-view controlling aperture 132, an angle-of-view controlling aperture driver 134, a circumference light-shielding controlling aperture 136, and a circumference light-shielding controlling aperture driver 138. Alternatively, the illumination optical system 120 may include, for example, as shown in FIG. 3, a condenser lens 121, an optical integrator 122, a condenser lens 123, imaging optical systems 124 and 126, an angle-of-view controlling aperture 132, an angle-of-view controlling aperture driver 134, a circumference light-shielding controlling aperture 136, and a circumference light-shielding controlling aperture driver 138.

The condenser lens 121 condenses the light from the light source section 110A into or near an incident surface of the optical integrator 122. The optical integrator 122 includes a combination of a plurality of fly-eye lenses, cylindrical lenses, and the like, and uniformly illuminates the resist R. The fly-eye lens has, as shown in FIG. 3, a plurality of rod lens elements, and its incident and exit surfaces are designed to be in an optically Fourier transformation relationship with each other. The curing of the resist R is determined by the irradiation dose (i.e., a product of the light intensity and the irradiation time period). An illumination with a non-uniform light intensity cures the resist R quickly at one place, and retards the cure at another place, lowering the total throughput. Hence, the uniform illumination effected by the optical integrator 122 as shown in FIG. 3 is preferable. Of course, as long as the lowered throughput is negligible, the non-uniform light intensity is permissible. The light from the light source 112A enters respective elements in the fly-eye lens, and is condensed near its exit surface, forming a so-called secondary light source. The light from the secondary light source formed by the respective elements in the fly-eye lens is condensed by the condenser lens 123, and is superposed onto the opening surface of the angle-of-view controlling aperture 132. Here, the plane of exit of the fly-eye lens and the aperture plane of the angle-of-view controlling aperture 132 are arranged in an optically Fourier transformation relationship.

Figure 4:
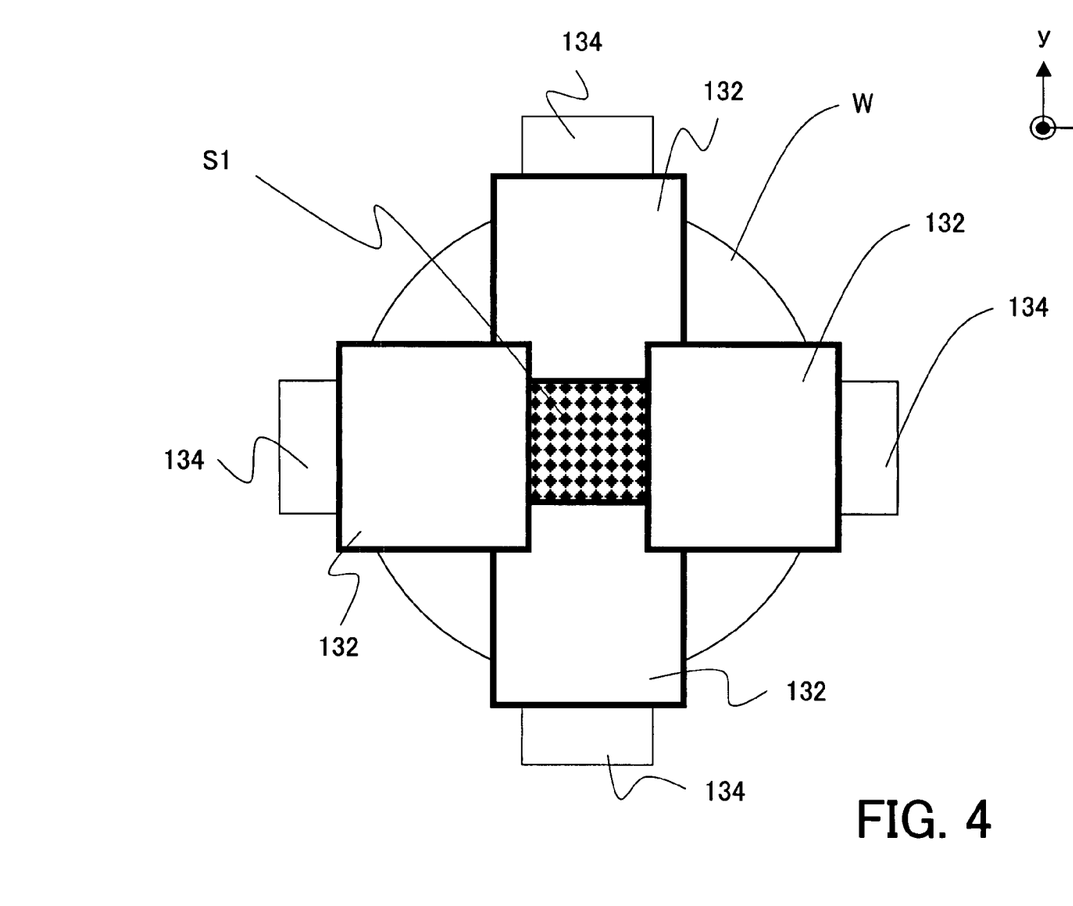
FIG. 4 is a schematic sectional view of an angle-of-view controlling aperture shown in FIGS. 2 and 3.

FIG. 4 is a schematic plan view showing a relationship among the angle-of-view controlling apertures 132, the angle-of-view controlling aperture driver 134, and the wafer W. The angle-of-view controlling aperture driver 134 drives each angle-of-view controlling aperture 132 in the XY directions in FIG. 4. This embodiment provides four angle-of-view controlling apertures 132, each of which is a light-shielding plate having the same rectangular shape (a square shape in FIG. 4).

These four angle-of-view controlling apertures 132 define one aperture, and the aperture defines the shot S1. Regardless of locations of these four angle-of-view controlling apertures, the aperture provides the same shape. Through the condensing function of the condensing lens 123, the UV light illuminates near the aperture in FIG. 4, and consequently only the shot S1. The shot S1 corresponds to the rectangular shot of the central part on the wafer W. As described later by referring to FIG. 8, the shot S1 means those shots other than the peripheral shots S2. As described below, the four angle-of-view controlling apertures 132 define the peripheral shots S2 in cooperation with the circumference light-shielding controlling aperture 136. The angle-of-view controlling aperture driver 134 includes, for example, a linear motor, and drives the angle-of-view controlling apertures 132 in the XY directions.

The light that is shaped similarly to the wafer W's exposure region by the angle-of-view controlling aperture 132 is imaged onto the circumference light-shielding controlling aperture 136 through an imaging system 124.

Figure 5:
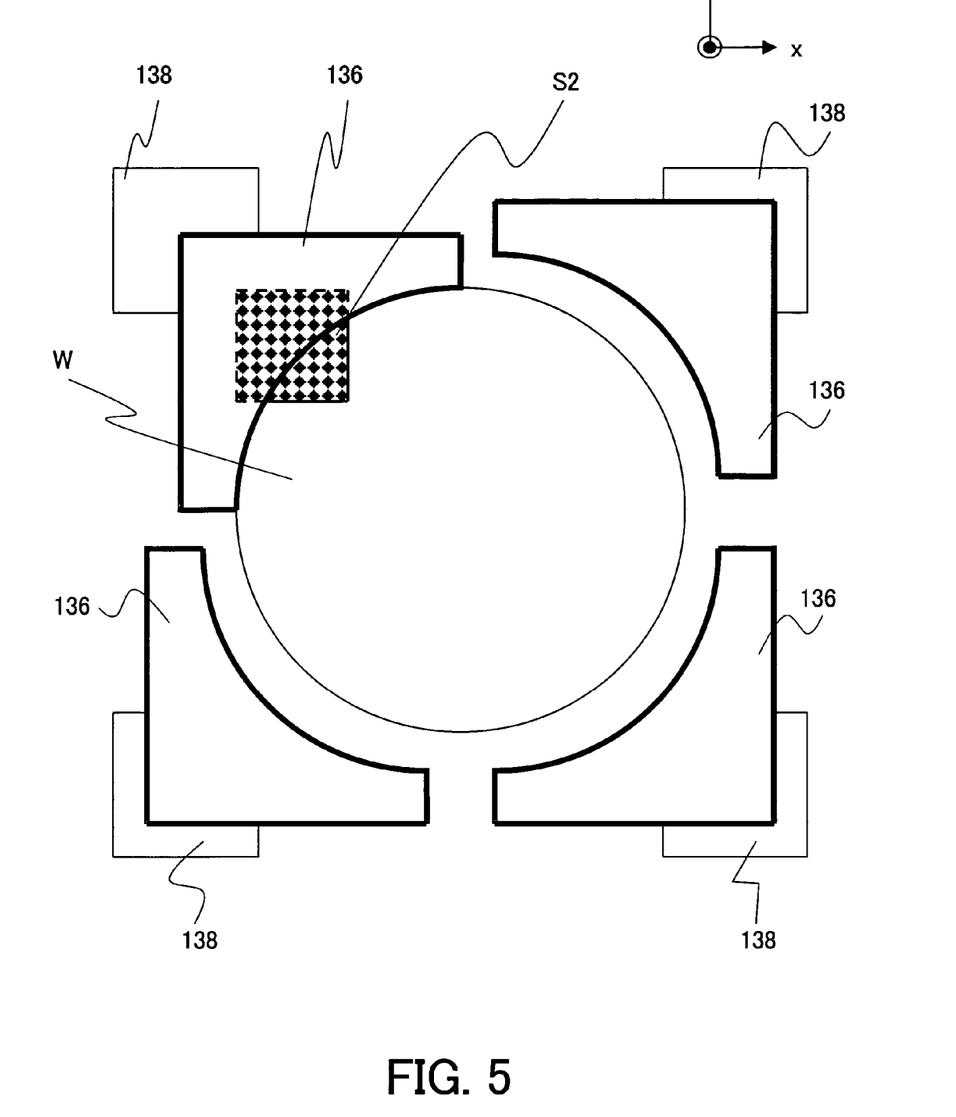
FIG. 5 is a schematic plan view of a circumference light-shielding aperture shown in FIGS. 2 and 3.

FIG. 5 is a schematic plan view showing a relationship among the circumference light-shielding controlling aperture 136, the circumference light-shielding controlling aperture driver 138, and the wafer W. Each circumference light-shielding controlling aperture 136 is driven in XY directions by the corresponding circumference light-shielding controlling aperture driver 138 shown in FIG. 5. This embodiment provides four circumference light-shielding controlling apertures 136, each of which restricts the UV light to be irradiated beyond the contour of the wafer W. Each circumference light-shielding controlling aperture 136 has an arc portion corresponding to a quadrant of the circular wafer W. If all the circumference light-shielding controlling apertures 136 approaches to the wafer W most closely, no light pass beyond the contour of the wafer W.

The circumference light-shielding controlling aperture 136 is used with the peripheral shot S2. FIG. 5 defines the peripheral shot S2 by two solid lines (X and Y directions) in the wafer W and the circumference light-shielding controlling aperture 136. As described, the two angle-of-view controlling apertures 132 define the two solid lines for the X and Y directions. More specifically, the circumference light-shielding controlling aperture 136 overlaps the circumference of the wafer W, as the upper left circumference light-shielding controlling aperture 136, or is arranged apart from the wafer W, as the upper right circumference light-shielding controlling aperture 136. The circumference light-shielding controlling aperture driver 138 includes, for example, a linear motor, and drives the circumference light-shielding aperture 134 in ±45° directions in FIG. 5.

The light that is not shielded by the circumference light-shielding controlling aperture 136 is led to the resist R through the imaging system 126 and the mold M. Here, the aperture surface of the angle-of-view controlling aperture 132 and the aperture surface of the circumference light-shielding controlling aperture 136 are arranged in an optically conjugate relationship, and they and the resist R are also arranged in an optically conjugate relationship.

The above embodiment arranges the imaging system 124 between the angle-of-view controlling aperture 132 and the circumference light-shielding controlling aperture 136. However, for a more compact illumination system, an alternate embodiment may arrange the aperture surface of the angle-of-view controlling aperture 132 conjugate with the resist R, use no imaging system, and provide the circumference light-shielding controlling aperture 136 near (or above or below) the angle-of-view controlling aperture 132. Preferably, the aperture surface of the angle-of-view controlling aperture 132 is conjugate with an existent surface of the resist R (between the contact surface of the resist R and the mold M, and the first surface of the resist R). More preferably, the resist R and the contacting surface of the mold M are conjugate with each other.

The mold (or template) M has a fine structure to be transferred, and is made of such a transparent material that it transmits the UV light for curing the resist R.

A mold driver 140 includes a mold chuck for holding the mold M in the apparatus 100, and an imprint mechanism as a driver that presses the mold M downwardly and releases the mold M upwardly in FIG. 1. The imprint mechanism moves the mold M longitudinally, and controls an orientation of the mold M and an alignment between the mold M and the wafer W for close contact between the mold transfer surface and the wafer W.

The wafer W is an object onto which a pattern on the mold M is transferred, and which is made into a semiconductor IC through the subsequent steps.

The wafer driver includes a wafer chuck 162 that holds the wafer W, and a wafer stage 164 for adjusting the position and orientation of the wafer chuck 162. The wafer stage 164 moves in XY plane directions, and enables the whole area of the wafer W to be transferred. The wafer stage 164 provides a precise alignment, and overlay of a fine pattern. The wafer stage 164 serves to position the wafer W, and adjust the orientation of the wafer W's surface.

The resist supply means includes a tank (not shown) that stores resist R that have not yet received the UV light or have not yet been cured, a nozzle 150 for dropping the resist R on the wafer surface, and a valve (not shown) that drops or stops dropping the resist R from the nozzle 150.

An alignment mechanism 170 aligns the mold M with the wafer W, and includes an automatic adjustment scope ("AAS") 172, an automatic adjustment ("AA") frame 174, an off-axis scope (OAS) 176, and a reference mark 178. The AAS 172 detects the relative positions of a mark made on the wafer stage 164 and a mark made on the mold M. The AA frame 174 mounts the AAS 172 and OAS 176. The OAS 176 uses the reference mark 178 on the wafer stage 164 to detect the position of the reference mark 178 by the AAS 172 via the mold M, and measures the baseline based on the reference mark 178's position detected by the OAS 176. After the baseline is measured, the position of an alignment mark on the wafer W is detected based on the reference mark 178. As mentioned above, the reference mark 178 is used for the alignment between the coordinate of the OAS 176, the coordinate of the wafer stage 164, and the coordinate of the mold M.

Other mechanisms include a stool 180, a damper 182, and frames 184 and 186. The stool 180 supports the whole apparatus 100 as well as forming a reference plane for the wafer stage 164 to move along. The damper 182 serves to eliminate vibrations from the floor, supporting the stool 180. The frames 184 and 186 support components from the light source 110 to the mold M above the wafer W.

In operation, the wafer W to be transferred is mounted on the wafer chuck 162 by a wafer feed system (not shown). The wafer chuck 162 holds the wafer W through the vacuum attraction means. The OAS 162 sequentially measures alignment marks on the wafer surface supported by the wafer stage 162, measuring the position of the wafer W with high precision. Each transfer coordinate is computed based on the measured results. Based on the results, a transfer is sequentially provided in a step-and-repeat manner. After all the transfers are completed, the wafer W is fed out and the next wafer W is fed in.

In transfer, before the wafer is moved to the transfer position, the nozzle 150 drops an adequate amount of resist to the transfer position. The wafer stage 164 then moves and positions the wafer W to the transfer position. Upon completion of the positioning, the imprint mechanism descends the mold M, and presses it against the wafer W. A load sensor in the imprint mechanism determines a completion of the pressing. After the mold is pressed, the illumination light is irradiated and cures the resist R. After the resist is cured, the mold M is pulled up and moved to the next transfer position (or shot).

Figure 8A:
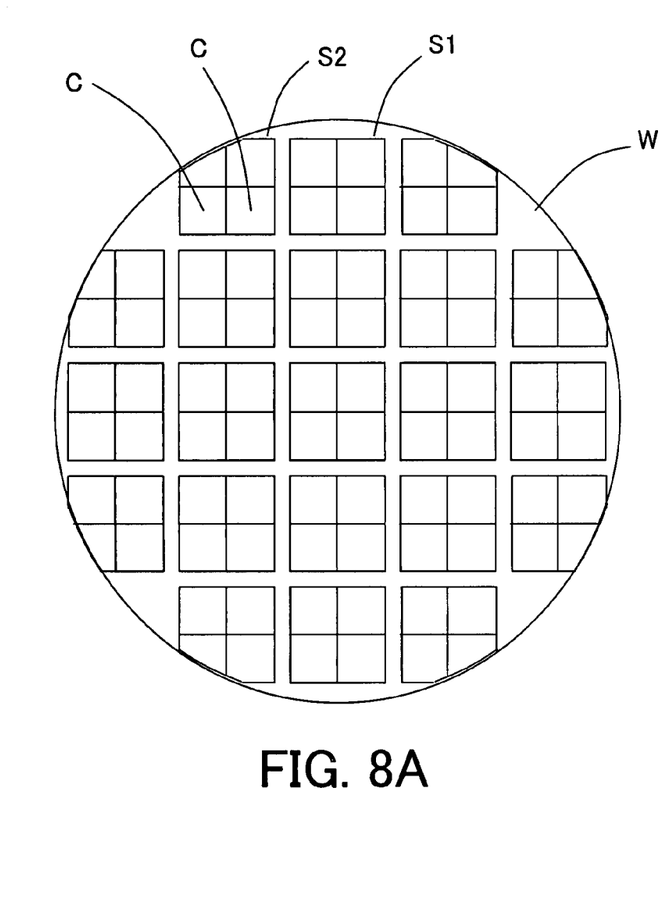
FIGS. 8A and 8B are plan views of the wafer shown in FIG. 1 with and without peripheral shorts to be exposed.

A detailed description will now be given of a transfer to the shot S1 and the peripheral shot S2. FIG. 8A shows a shot layout of the wafer W. S1 denotes areas patterned by the mold M, i.e., an area (shot) that is formed by a one mold pressing and exposure light irradiation. Each shot has four similar patterns 52, and each pattern C corresponds to one semiconductor chip. For convenience of explanation, C is referred to as a chip. In other words, a four device patterns (chips C) are transferred per shot. The layout in FIG. 8A is an example of 21 shots. When a mold pattern is transferred to the shot S1, the angle-of-view controlling aperture driver 134 drives the angle-of-view controlling aperture 132, as described with reference to FIG. 4, so that the four angle-of-view controlling apertures 132 may open only the shot S1.

The shot layout of FIG. 8A includes peripheral shots S2 at the wafer's periphery to which a complete pattern cannot be transferred. However, it is understood that two chips out of four in the peripheral shot S2 are not defective and thus can be effectively used. In transferring a mold pattern to the peripheral shot S2, the circumference light-shielding aperture 138 drives the circumference light-shielding controlling aperture 136, as shown in FIG. 5, to shield the light for that part of the peripheral shot S2 cut away by the wafer W's contour. The angle-of-view controlling aperture 132 defines the area of the peripheral shot S2 inside the wafer as described with reference to FIG. 4.

Figure 11A:
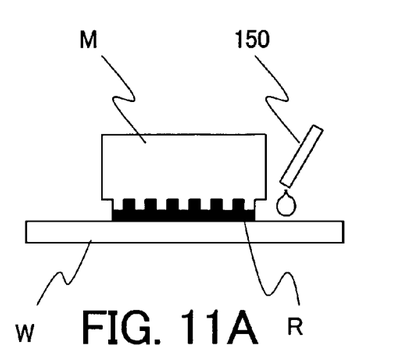
FIGS. 11A to 11F are schematic sectional and plane views for explaining problems of a transfer of a pattern to the central and peripheral shots using the angle-of-view controlling aperture without the circumference light-shielding aperture.
Figure 11B:
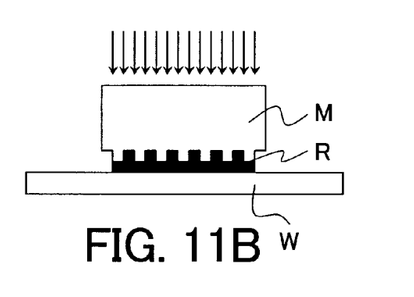
Figure 11C:
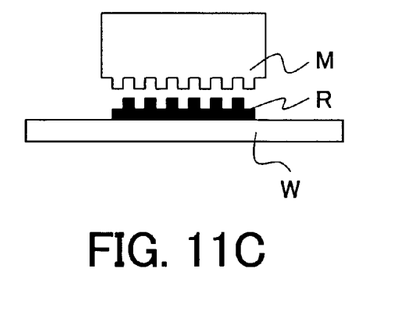
Figure 11D:
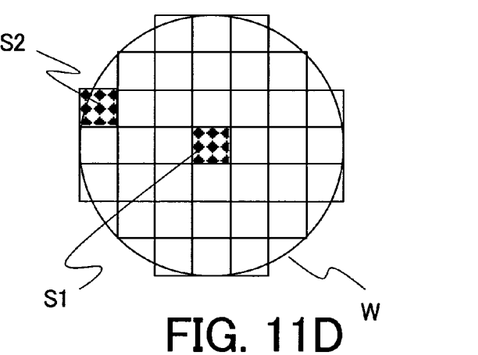
Figure 11E:
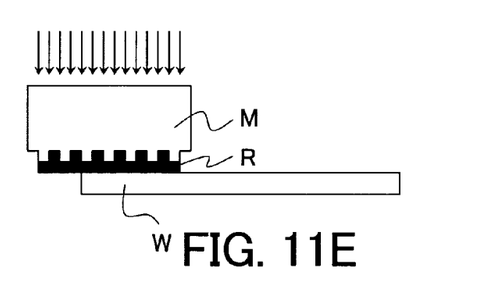
Figure 11F:
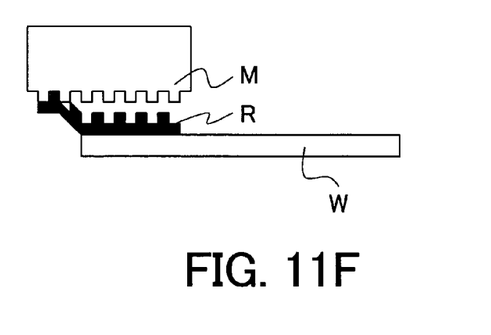

In transferring a pattern to the peripheral shot S2, use of only the angle-of-view controlling aperture 132 causes the UV light to be irradiated onto an area surrounded between a dotted line and the wafer W's contour in FIG. 5, and to cure the resist R. FIG. 11 shows this state. Here, FIGS. 11A to 11F show a transfer of the mold pattern with only the angle-of-view controlling aperture 132 for the shots S1 and S2. More specifically, FIG. 11A-C, E and F are schematic sectional views, and FIG. 11D is a schematic plan view. The mold M is released as shown in FIG. 11C with no problem after the UV light is irradiated, as shown in FIG. 11B, onto the shot S1 shown in FIG. 11D. On the other hand, when the mold M is released as shown in FIG. 11F after the UV light is irradiated, as shown in FIG. 11E, onto the peripheral shot S2 shown in FIG. 11D, the resist R remains on and adheres to the released mold M in the area outside the wafer W, clogging the mold pattern. As a result, the mold M cannot be used for the next transfer unless cured resist R is removed from the mold M. Otherwise, the cured resist R becomes a foreign particle, causes a defect in the next pattern transfer, and lowers the poor yield. Thus, a transfer of a mold pattern to the peripheral shot S2 has been difficult.

Figure 8B:
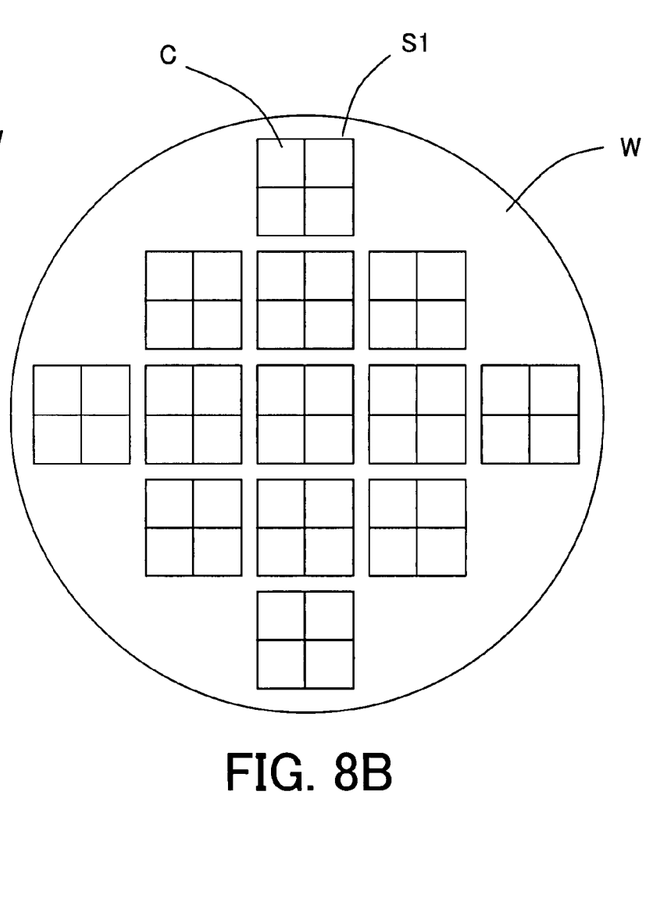

On the other hand, this embodiment does not irradiate the UV light to resist R in the areas outside the wafer W, or cure the resist R there. Therefore, even if resist R remains in the mold M after the mold is released, the resist R does not clog the mold pattern. The mold M when pressed against the pre-cured resist R next time can perfectly transfer the mold pattern to the resist R, although the amount of resist R is slightly more than the expected because the resist R remains on the mold M. This configuration provides more valid semiconductor chips by 16 per wafer than the layout shown in FIG. 8B in which no peripheral shots S2 are transferred so as to protect the mold from damages. Here, the layout of FIG. 8B is a conventional example of 13 shots, which has no peripheral shots.

Figure 6:
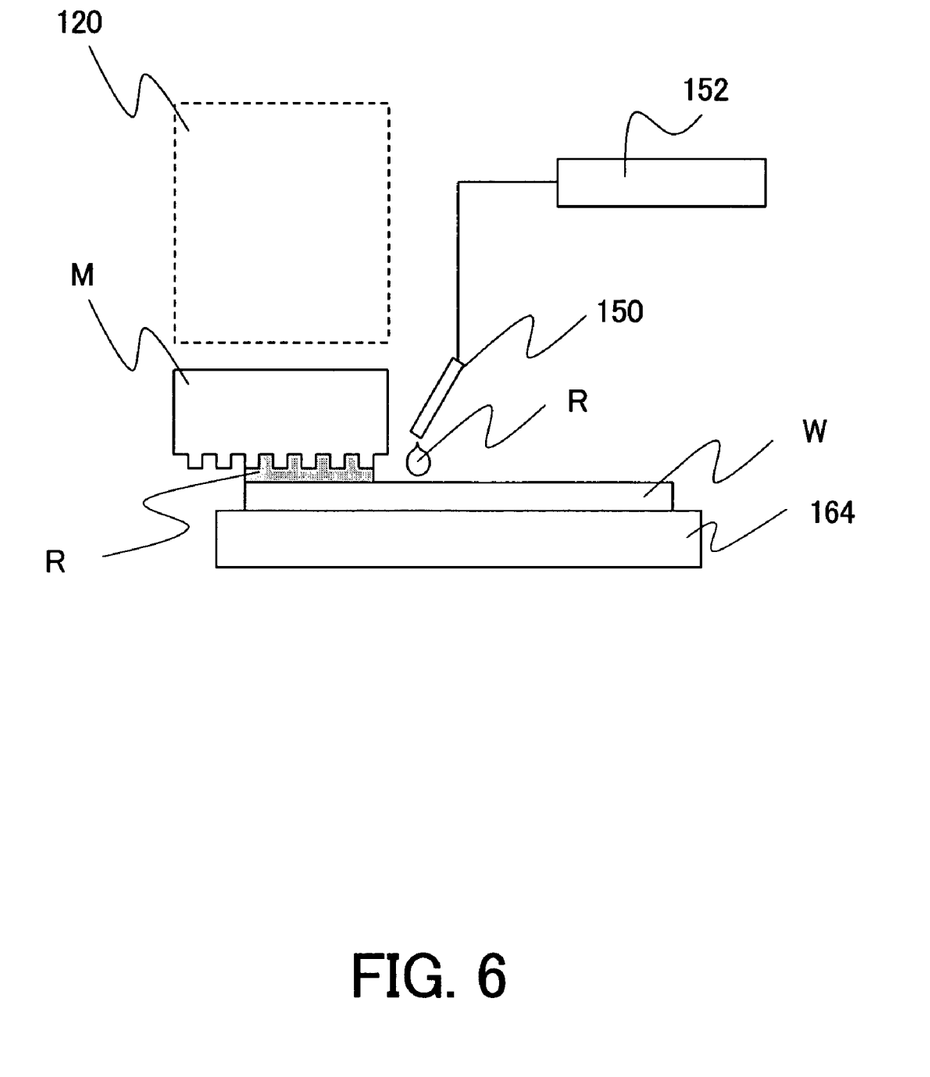
FIG. 6 is a schematic sectional view that shows a preferred embodiment of the processing or (nanoimprint) apparatus shown in FIG. 1.

As shown in FIG. 6, the nanoimprint apparatus 100 preferably further include a supply amount controller 152. In place of adding the supply amount controller 152, the circumference light-shielding controlling aperture 136 and the circumference light-shielding controlling aperture driver 138 may be removed from the illumination optical system 120. However, in order to securely protect the mold M from the cured resist R, it is preferable to provide the circumference light-shielding controlling aperture 136 and the circumference light-shielding controlling aperture driver 138.

The supply amount controller 152 computes the necessary amount of resist R, and controls the amount of resist R to be supplied from the nozzle 150 based on this calculated result. For example, the supply amount controller 152 calculates the overlapping area between the mold M and the wafer W based on the coordinate position of the wafer stage 164, multiplies the area by a gap between the average height of the mold pattern and the wafer W, and obtains the volume as the necessary supply amount. This configuration supplies the resist R only to the overlapping area between the mold M and the wafer W, thus preventing the cured resist R from adhering to the mold M. Control over the resist R's supply amount also has an effect of preventing the unnecessary resist R from spilling from the wafer W and contaminating the wafer chuck 162 and wafer stage 164.

Figure 7:
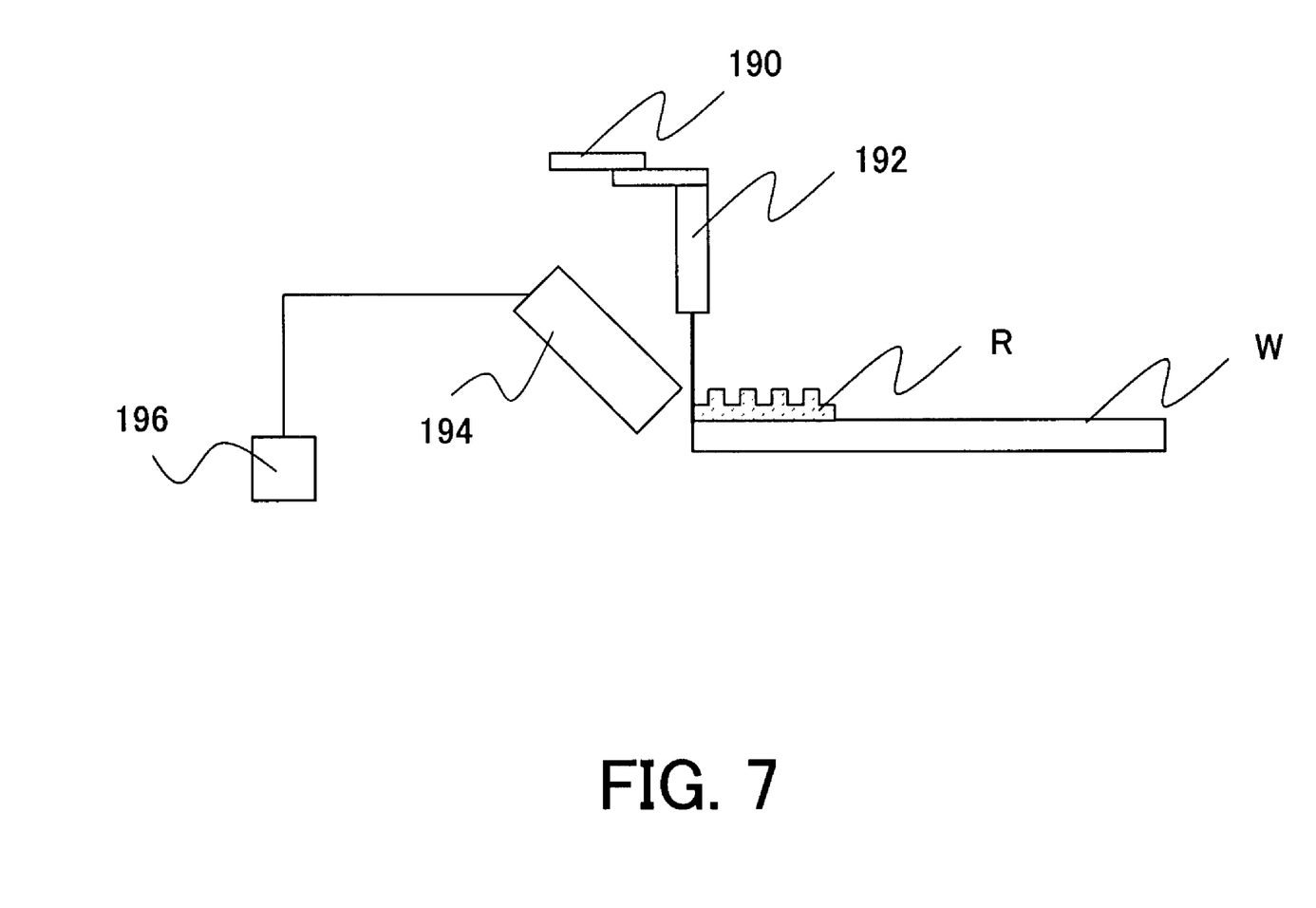
FIG. 7 is a schematic sectional view showing a processing (nanoimprint) apparatus according to one embodiment.

Referring now to FIG. 7, a description will be given of a measure to an insufficient irradiation dose from the illumination optical system 120. Here, FIG. 7 is a schematic sectional view of essential parts of the structure that replenishes an irradiation dose after the mold M is released. The insufficient irradiation dose does not completely cure the resist R disadvantageously, and results in the pattern collapse, etc., although the incompletely cured resist R does not adhere to the releasing mold M.

As shown in FIG. 7, the UV light is again irradiated onto the releasing mold M from the laser irradiator 192 to cure the resist R. The laser irradiated from the laser irradiator 192 forms a spot beam on the wafer W through an optical system (not shown). The laser driver 190 irradiates the spot beam in the transfer area on the wafer, and cures the resist. While this embodiment drives the laser irradiation position via the laser driver 190, but the present invention is not limited to this embodiment and may provide the laser irradiator 192 with a deflection function and deflect the laser to cure the resist at the periphery of the transfer area. Further, an UV lamp may be used instead of the laser irradiator 192. As a result, the transfer area has the completely cured resist R.

This embodiment removes the excess resist R from the wafer W. A cutter preferably removes the cured resist R beyond the contour of the wafer W. The cutter may use a method that increases the laser irradiation amount from the laser irradiator 192 to serve as a laser cutter or a removal through grinding. A vacuum pumping means recovers the removed resist R. For illustration convenience, FIG. 7 omits valves, a pressure gauge, and a pressure-regulating valve in the pipeline.

Figure 9:
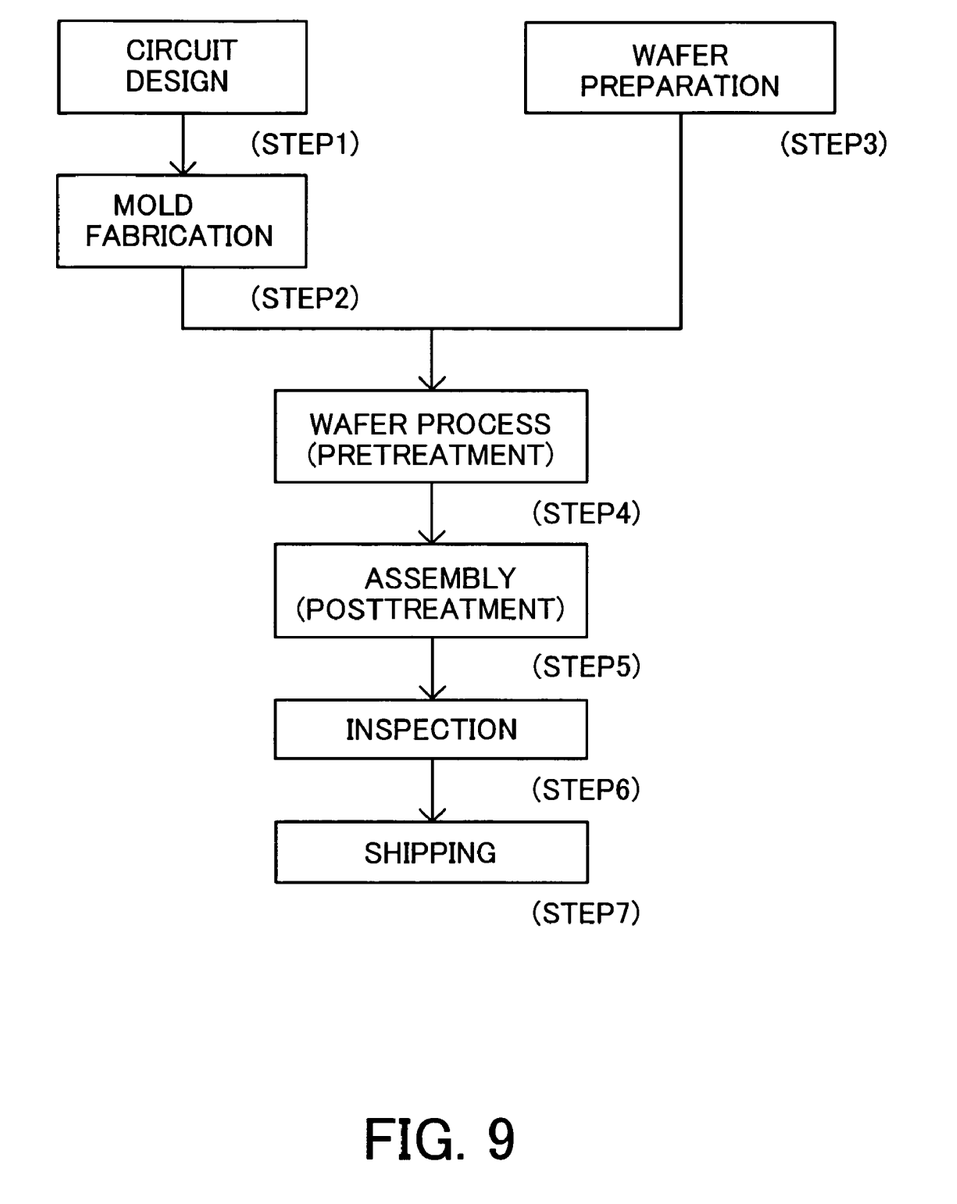
FIG. 9 is a flowchart for explaining a method for manufacturing a device (semiconductor chips such as ICs, LSIs, and the like, LCDs, CCDs, etc.) using the above processing apparatus shown in FIG. 1.
Figure 10:
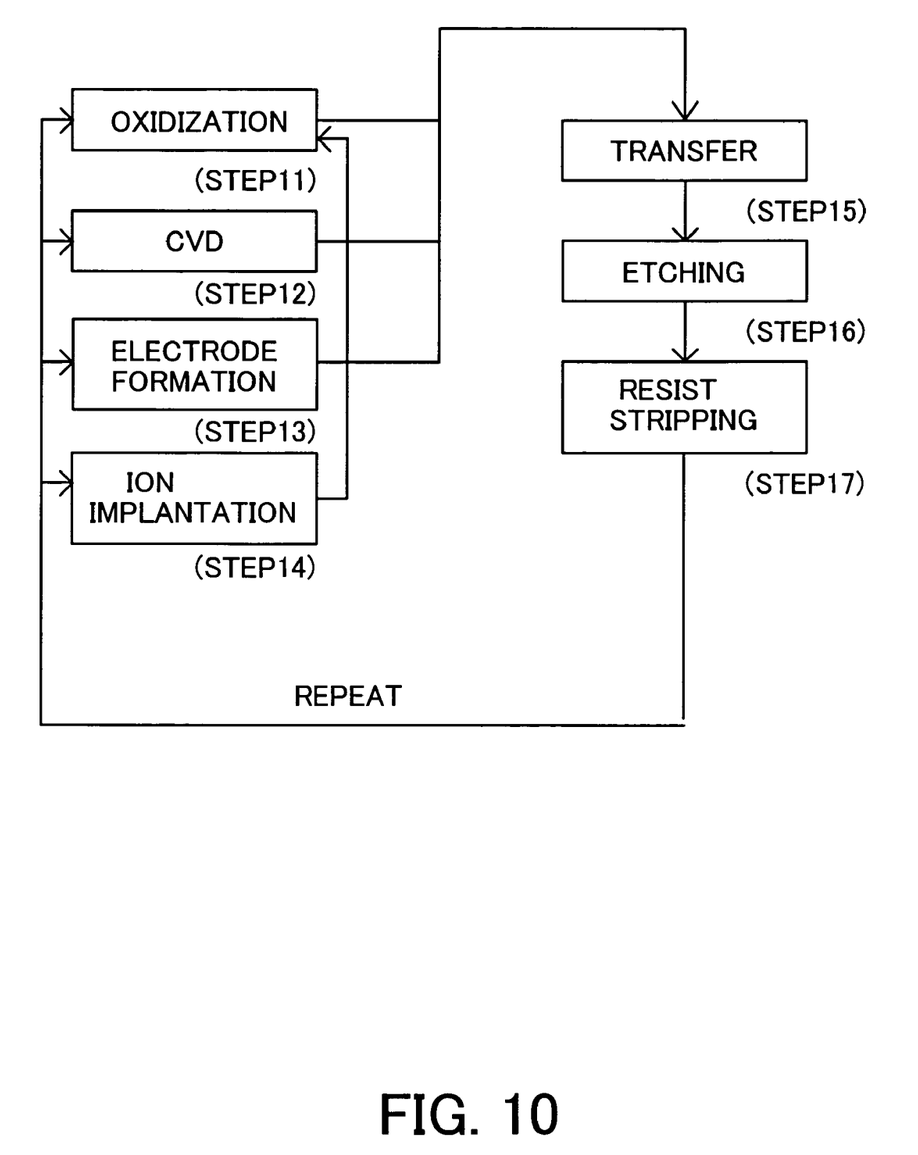
FIG. 10 is a detailed flowchart for Step 4 shown in FIG. 9.

Referring now to FIGS. 9 and 10, a description will be given of an embodiment of a device manufacturing method using the above nanoimprint apparatus. FIG. 9 is a flowchart for explaining how to fabricate devices (i.e., semiconductor chips such as IC and LSI, LCDs, CCDs, etc.). Here, a description will be given of the fabrication of a semiconductor chip as an example. Step 1 (circuit design) designs a semiconductor device circuit. Step 2 (mold fabrication) forms a mold that forms a pattern corresponding to a designed circuit pattern. Step 3 (wafer preparation) manufactures a wafer using materials such as silicon. Step 4 (wafer process), which is also referred to as a pretreatment, forms actual circuitry on the wafer through the nanoimprint technique using the mold and wafer. Step 5 (assembly), which is also referred to as a post-treatment, forms into a semiconductor chip the wafer formed in Step 4 and includes an assembly step (dicing and bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (transfer) presses the mold against the wafer while applying a photosensitive material to the wafer, and irradiates the UV light to transfer the circuit pattern onto the wafer. Step 16 (etching) uses reactive ion etching (RIE) to complete the patterning operation. Step 17 (resist stripping) removes disused resist after etching. Thus, devices (i.e., semiconductor chips, LCD devices, photographing devices (such as CCDs, etc.), thin-film magnetic heads, and the like) are fabricated. These steps are repeated, and multi-layer circuit patterns are formed on the wafer. The device manufacturing method of this embodiment uses the photo-curing method and maintains the high overlay accuracy. In addition, the use of the low-viscosity resist easily covers a fine mold pattern realizing the fine processing, and a transfer of the mold pattern to the peripheral shot improves the economical efficiency. Moreover, a recovery of the resist can prevent the contamination of the apparatus and wafer, providing high-quality devices. Thus, the device manufacturing method using the nanoimprint technology of this embodiment, and devices as a resultant product constitute one aspect of this invention. The present invention intends to cover devices as intermediate and final products of this device manufacturing method. Such devices include semiconductor chips such as LSI, VLSI and the like, CCDs, LCDs, magnetic sensors, thin film magnetic heads, and the like.

This embodiment does not cure the resist R beyond the contour of the wafer W in transferring a mold pattern to the peripheral shot, by shielding the UV light beyond the contour of the wafer W using the circumference light-shielding aperture 132, or by supplying the resist R only between the wafer W and the mold M using the controller 152 to control a supply amount of resist R. Accordingly, the cured resist does not become a foreign matter or cause a defect to the pattern transfer. Therefore, the productivity of device fabrication improves.

This embodiment can thus provide a processing apparatus having good overlay accuracy and economical efficiency, and providing fine processing, by preventing the resist from adhering to the mold.

Further, the present invention is not limited to these preferred embodiments, and various variations and modifications may be made without departing from the scope of the present invention.

This application claims a benefit of priority based on Japanese Patent Application No. 2004-096992, filed on Mar. 29, 2004, which is hereby incorporated by reference herein in its entirety as if fully set forth herein.

What is claimed is:

1. A processing apparatus for transferring a relief pattern on a mold to a resist on a substrate including an arc shaped contour through a compression of the mold against the resist and forming a plurality of shots so that the pattern is transferred in a step-and-repeat manner, said processing apparatus comprising:
  a supplier for supplying the resist between the substrate and the mold; and
  an illumination optical system for illuminating ultraviolet light onto the resist via the mold so as to cure the resist, the illumination optical system including a first aperture in a first position and a second aperture in a second position different from the first position, the first position being conjugate with any positions within an existent range of the resist in a light path of the illumination optical system in a direction perpendicular to a plane that the relief pattern is transferred to the resist,
  wherein the first aperture includes a plurality of first light-shield members and, in the first position, restricts an angle of view by defining an illumination area having a rectangular shape using the plurality of the first light-shield members,
  wherein the second aperture includes a plurality of second light-shield members having an arc shaped portion and, in the second position, restricts an angle of view by defining an illumination area in which the irradiation of the ultraviolet light along and beyond the contour of the substrate is restricted using the plurality of the second light-shield members, and
  wherein when forming shots in a proximity of a central part of the substrate, the first aperture restricts the illumination area and, when forming shots in a peripheral part of the substrate, both the first aperture and the second aperture restrict the illumination area.

2. A processing apparatus according to claim 1, wherein said illumination optical system includes an optical integrator for uniformly illuminating the resist using the ultraviolet light.

* * * * *